United States Patent
Iizuka

(10) Patent No.: US 7,586,955 B2
(45) Date of Patent: Sep. 8, 2009

(54) INTERFACE CIRCUIT AND SEMICONDUCTOR DEVICE

(75) Inventor: Yoichi Iizuka, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 432 days.

(21) Appl. No.: 11/494,698

(22) Filed: Jul. 28, 2006

(65) Prior Publication Data
US 2007/0047337 A1    Mar. 1, 2007

(30) Foreign Application Priority Data
Aug. 24, 2005    (JP) ............................. 2005-243373

(51) Int. Cl.
*H04J 3/06*     (2006.01)
*G11C 7/00*     (2006.01)

(52) U.S. Cl. ........................ 370/516; 365/193

(58) Field of Classification Search ............... None
See application file for complete search history.

(56) References Cited

U.S. PATENT DOCUMENTS

| | | | |
|---|---|---|---|
| 6,333,875 B1 * | 12/2001 | Shinozaki | 365/193 |
| 6,348,826 B1 * | 2/2002 | Mooney et al. | 327/270 |
| 6,397,312 B1 * | 5/2002 | Nakano et al. | 365/193 |
| 6,510,503 B2 * | 1/2003 | Gillingham et al. | 711/167 |
| 7,171,321 B2 * | 1/2007 | Best | 365/193 |
| 7,330,502 B2 * | 2/2008 | Hotta | 375/221 |
| 7,412,616 B2 * | 8/2008 | Matsui et al. | 713/401 |
| 2005/0047192 A1 | 3/2005 | Matsui et al. | |

FOREIGN PATENT DOCUMENTS

JP        2005-78547        3/2005

* cited by examiner

*Primary Examiner*—Steven Nguyen
(74) *Attorney, Agent, or Firm*—McGinn IP Law Group, PLLC

(57) ABSTRACT

A circuit that enables a loop-back test by adjusting phases of data and strobe signals at the input and output in an interface wherein the phase relationships between the data and the strobe signal for sampling the data are different between the input and output. In order to test a phase shift circuit 30 and a sampling circuit 40 on the input side, DQ and DQS are outputted with their phases aligned by a phase shift circuit 20 on the output side, DQ and DQS having the same phase are fed to input buffers 16 and 17, respectively, from output buffers 14 and 15, the phase of DQS is shifted by 90 degrees by phase shift circuit 30, and DQ is sampled by sampling circuit 40. In order to test the output function, the phase shift circuit 30 is controlled so that the phase of DQS is not shifted on the input side, the phase shift circuit 20 on the output side sets phase shift amount of the data sampling clock to 90 degrees, phase shift amount of DQS is fixed at 180 degrees, DQS whose phase has already been shifted by 90 degrees from that of DQ is fed to the input buffer 17 from output buffer 15, phase is not shifted by the phase shift circuit 30, and the sampling circuit 40 samples DQ looped back using DQS whose phase is shifted by 90 degrees.

13 Claims, 4 Drawing Sheets

US 7,586,955 B2

INTERFACE CIRCUIT AND SEMICONDUCTOR DEVICE

FIELD OF THE INVENTION

The present invention relates to a semiconductor device and particularly to a structure suitable for high-speed testing of an interface in which the input and output phases of a signal and a strobe signal sampling the signal are different.

BACKGROUND OF THE INVENTION

Since DDR SDRAM (Double Data Rate Synchronous Dynamic Random Access Memory) performs the input/output of data at twice the frequency of the external clock using both the rising and falling edges of the clock, the valid data window is narrower than that of SDR SDRAM (Single Data Rate Synchronous Dynamic Random Access Memory). In DDR SDRAM, a bi-directional data strobe signal DQS is used because the controller side notifies the timing of the data transfer from the DRAM to the receiver and the DRAM notifies the timing of the data transfer from the controller to the receiver. In other words, the data strobe signal DQS is used as an operation reference clock for data input/output during read/write operations.

During a read operation, the edges of the data strobe signal DQS from the DDR SDRAM and read data DQ coincide (the edges of clock signals CK and /CK approximately coincide with them as well) as shown in FIG. 3 because of a DLL (Delay Lock Loop) circuit and internal control within the DDR SDRAM. Therefore, the interface (the controller), not shown in the drawing, performs sampling upon delaying the data strobe signal DQS until the center of the read data DQ using a phase shift circuit disposed in the controller when the interface receives the read data DQ and the data strobe signal DQS from the DDR SDRAM (refer to Patent Document 1). Further, in FIG. 3, the phase between the edges of the data strobe signal DQS against one cycle (360 degrees) of the clock signals CK and /CK is 180 degrees, and the interface circuit (the controller) phase shifts the data strobe signal DQS by 90 degrees and samples the read data DQ during a read operation.

Further, during a write operation, the rising and falling edges of the DQS supplied by the interface (the controller) side, not shown in the drawing, to the DDR SDRAM are placed in the center of write data DQ as shown in FIG. 3. The DQS is supplied to DDR SDRAM with its phase delayed by 90 degrees in relation to that of the DQ as shown in FIG. 3. The receiver of the DDR SDRAM fetches data based on the rising and falling transitions of the DQS as references.

The circuit structure of the output and input sides of the data DQ and the data strobe signal DQS in the conventional DDR SDRAM interface is schematically shown in FIG. 4. Referring to FIG. 4, on the output side, a phase shift circuit 20' outputs the data DQ with its phase shifted by 90 degrees in relation to that of the clock signal CLK (a synchronous signal supplied to the interface and the DDR SDRAM) and outputs the data strobe signal DQS with its phase shifted by 180 degrees in relation to that of the same clock signal CLK. Latch circuits 12 and 13 latch the DQ and the DQS, respectively, using the clock from the phase shift circuit 20' and output to output terminals via output buffers 14 and 15, respectively. By doing this, the setup/hold time of the receiver of the DDR SDRAM, not shown in the drawing, can be obtained.

The read data DQ and the data strobe signal DQS are outputted from the DDR SDRAM at the same timing on the input side, and input buffers 16 and 17 receive the read data DQ and the data strobe signal DQS outputted from the DDR SDRAM, respectively. A phase shift circuit 30' outputs the data strobe signal DQS with its phase shifted by 90 degrees and a sampling circuit 40 samples the read data DQ from the input buffer 16 based on the data strobe signal outputted from the phase shift circuit 30' with its phase shifted by 90 degrees (refer to Patent Document 1). By doing this, the setup/hold time of the sampling circuit 40 can be obtained.

For instance, when testing the output function (the circuit system that shifts the phases of the write data and the data strobe signal DQS by 90 degrees and 180 degrees and output them to the DDR SDRAM) of the interface shown in FIG. 4, an output signal is compared to an expected value using a tester (ATE: Automatic Test Equipment). Further, when testing the input/output function (the circuit system that receives the read data and the data strobe signal DQS from the DDR SDRAM, shifts the phase of the data strobe signal DQS by 90 degrees, and samples the read data) of the interface, a signal is fed by the tester to see whether or not it operates normally.

Further, the interface is applied to, for instance, AMB (Advanced Memory Buffer) on DIMM such as FB-DIMM (Fully Buffered Dual Inline Memory Module). The AMB sends/receives data to/from the DRAM on the DIMM, buffers the data internally on the chip, and sends/receives the data to/from the AMB on the subsequent DIMM or the memory controller using point-to-point communication.

[Patent Document 1]
JP Patent Kokai Publication No. JP-P2005-78547A

SUMMARY OF THE DISCLOSURE

As described with reference to FIG. 4, a high-speed tester is required to test the output and input functions of the interface for the high-speed DDR SDRAM. High-speed testers are expensive and using them will increase testing costs. Further, the increase in the testing costs results in an increase in manufacturing costs.

One might think that a self loop-back test can be applied as means for testing the above-described interface in order to use a low-speed tester for mass production test instead of a high-speed tester. However, since the phase between the data DQ and the data strobe signal DQS is different between the input and output stages in the DDR SDRAM and its interface, it is not possible to perform the loop-back test in which the outputs of the DQ and DQS from the output buffers of the interface are respectively looped back to the input buffers of the DQ and DQS of the interface.

For instance, in FIG. 4, when the DQ and DQS outputted from the output buffers 14 and 15 with their phases shifted by 90 degrees and 180 degrees, respectively, by the phase shift circuit 20' on the output side are looped back to the input buffers 16 and 17, the phase of the DQS is shifted by 90 degrees by the phase shift circuit 30', and the DQ is sampled, it would result in the occurrence that the DQ is sampled based on the DQS whose phase is shifted by 180 degrees relative to that of DQ on the input side, and the edges of the DQ and DQS overlap. This means that the transition point of the DQ is subjected to sampling (the edges of the DQ and DQS overlap). Therefore, the input and output functions of the interface cannot be accurately tested by the loop-back test, which offers a problem in the art.

In order to solve the problems described above, the structure of the present invention disclosed in the present application is summarized as follows.

According to a first aspect of the present invention there is provided an interface circuit for receiving and outputting a data signal and a strobe signal that regulates the timing of sampling the data signal in which the phase relationships between the data signal and the strobe signal are different between the input and output. The interface circuit comprises: a circuit that controls to switch the phase difference between the data signal and the strobe signal outputted on the side that outputs the data signal and the strobe signal, the circuit varying the phase shift amount of at least one of a data signal outputted and a strobe signal outputted based on a phase switching control signal supplied; and a circuit that controls to switch the phase difference between the data signal and the strobe signal received on the side that receives the data signal and the strobe signal, this circuit varying the phase shift amount of at least one of a data signal received and a strobe signal received based on the phase switching control signal.

According to a second aspect of the present invention, there is provided an interface circuit. In the interface circuit, an output side circuit that outputs the data signal and the strobe signal comprises a first phase shift circuit that selects one from at least two phase shift amounts based on a phase switching control signal supplied, to shift the phase of the data signal by the selected phase shift amount, and to shift the phase of the strobe signal by a predetermined phase shift amount. Further, an input side circuit that receives the data signal and the strobe signal comprises: a second phase shift circuit that selects one from at least two phase shift amounts based on the phase switching control signal to shift the phase of the strobe signal received by the selected phase shift amount, and a sampling circuit that samples the data signal received in response to a strobe signal outputted from the second phase shift circuit.

In the interface circuit relating to the present invention, the first and second phase shift circuits respectively: during normal read and write operations, select a phase shift amount regulated according to a predetermined input and output phase relationship between the data signal and the strobe signal, and during testing, select a phase shift amount specified by the phase switching control signal according to a test content, so as to verify whether or not the phase relationship between a data signal and a strobe signal in the input side circuit is normal to operate and/or whether or not the phase relationship between a data signal and a strobe signal in the output side circuit is normal to operate, by looping back the data signal and the strobe signal to the input side circuit from the output side circuit.

In the interface circuit relating to the present invention, during normal operation, the first phase shift circuit shifts the phase of the data signal so that the relative phase between the data signal and the strobe signal is a first predetermined value in the output side circuit; during a normal read operation, the second phase shift circuit shifts the phase of the strobe signal by the first value in the input side circuit; and when the input side circuit is tested: the first phase shift circuit aligns the phases of the data signal and the strobe signal in the output side circuit, the input side circuit receives the data signal and the strobe signal having the same phase outputted from the output side circuit, and the second phase shift circuit shifts the phase of the strobe signal by the first value and outputs it to the sampling circuit.

In the interface circuit relating to the present invention, when the output side circuit is tested, the first phase shift circuit sets the relative phase between the data signal and the strobe signal to the first value in the output side circuit and the second phase shift circuit sets the phase shift amount of the strobe signal to zero in the input side circuit.

In the interface circuit relating to the present invention, the data signal and the strobe signal may be a data signal DQ and a data strobe signal DQS of a DDR SDRAM. In this case, during a normal operation, the first phase shift circuit sets the phase difference between the data signal and the strobe signal to 90 degrees in the output side circuit; and during a normal read operation, the second phase shift circuit shifts the phase of the strobe signal received by 90 degrees and outputs it to the sampling circuit in the input side circuit, and when the input side circuit is tested. When the input side circuit is tested, the first phase shift circuit aligns the phases of the data signal and the strobe signal in the output side circuit, the input side circuit receives the data signal and the strobe signal having the same phase outputted from the output side circuit, and the second phase shift circuit shifts the phase of the strobe signal received by 90 degrees.

In the interface circuit relating to the present invention, when the output side circuit is tested; the first phase shift circuit sets the phase difference between the data signal and the strobe signal to 90 degrees in the output side circuit, the input side circuit receives the data signal and the strobe signal having the same phase outputted from the output side circuit, and the second phase shift circuit sets the phase shift amount of the strobe signal received to zero.

In the interface circuit, there is further provided a pattern generator circuit that generates a test pattern and a checker circuit that receives data sampled by the sampling circuit of the input side circuit so as to compare the sampled data with an expected value pattern, wherein the phase of a test pattern from the pattern generator circuit is shifted as the data signal, and the test pattern is looped back to the input side circuit from the output side circuit during test. A semiconductor device comprises the interface circuit as disclosed herein.

The meritorious effects of the present invention are summarized as follows.

According to the present invention, in an interface such as an interface of a DDR SDRAM in which the phase relationships between data and a strobe signal for sampling the data are different between the input and output, a loop-back test is made possible by adjusting the phases of the data and strobe signals at the input and output.

BRIEF DESCRIPTIONS OF THE DRAWINGS

PREFERRED EMBODIMENTS OF THE INVENTION

Figure 1:
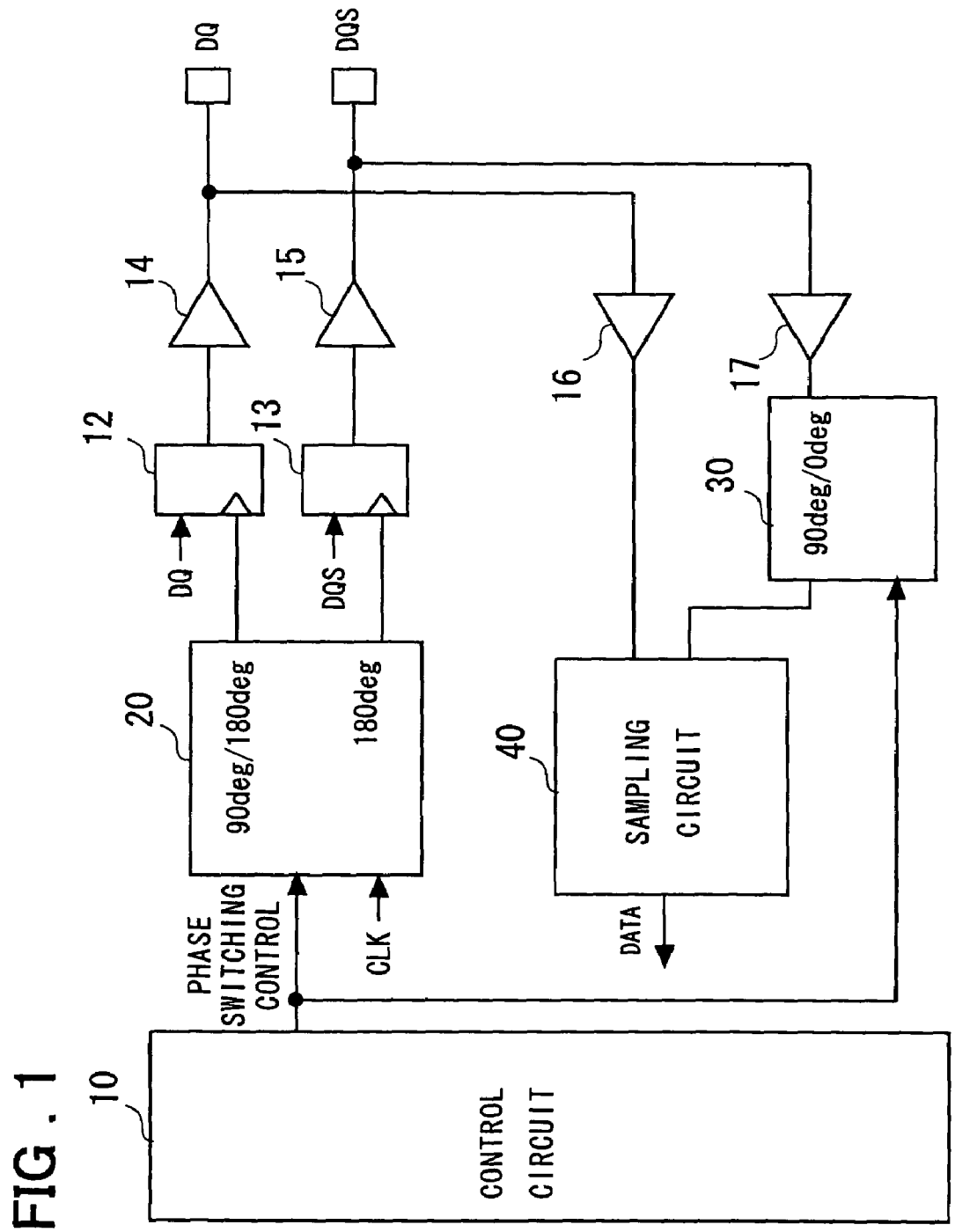
FIG. 1 is a drawing for explaining the operation principle of an embodiment of the present invention.

Preferred embodiments of the above-described present invention are further explained in detail with reference to the attached drawings. FIG. 1 is a drawing illustrating the structure of an embodiment of the present invention. Referring to FIG. 1, a circuit relating to an embodiment of the present invention is an interface circuit for sending/receiving data to/from a DDR SDRAM (not shown in the drawing) and a phase shift circuit 30 has the function of switching the phase shift amount of the sampling clock of the output data DQ between 90 degrees and 180 degrees based on a phase switching control signal from a control circuit 10 on the output side of the data DQ and a data strobe signal DQS.

For instance, when data is outputted to the DDR SDRAM, the phase shift circuit 20 sets the phase shift amount of the sampling clock of the output data DQ to 90 degrees and sets the phase shift amount of the sampling clock of the data strobe signal DQS to 180 degrees. As a result, the DQS is delayed by 90 degrees in relation to the DQ.

When testing the output function (i.e., function of the output side) by the loop-back test, the phase shift circuit 20 sets the phase shift amount of the sampling clock of the output data DQ to 90 degrees as well. The phase shift amount of the sampling clock of the data strobe signal DQS is fixed at 180 degrees by the phase shift circuit 20. As a result, the DQS is delayed by 90 degrees in relation to the DQ.

When testing the input function (i.e., function of the input side) by the loop-back test, the phase shift circuit 20 sets the phase shift amount of the sampling clock of the output data DQ to 180 degrees. The phase shift amount of the sampling clock of the data strobe signal DQS is set to 180 degrees by the phase shift circuit 20. As a result, the DQ and the DQS having the same phase are outputted.

Further, on the input side, the phase shift circuit 30 controls to switch the phase shift amount of the data strobe signal DQS supplied to an input buffer 17 between 90 degrees and 0 degrees (no phase shift) based on the phase switching control signal from the control circuit 10.

For instance, when operating normally, the phase shift circuit 30 outputs the data strobe signal DQS from the DDR SDRAM to the sampling circuit 40 with its phase shifted by 90 degrees. Further, when the input function is tested by the loop-back test, and the DQ and DQS having the same phase are outputted from the output side and received by input buffers 16 and 17 respectively, the phase shift circuit 30 shifts the phase of the DQS by 90 degrees and outputs it to the sampling circuit 40.

When the output function is being tested by the loop-back test and the DQ and DQS whose phase is delayed by 90 degrees are outputted from the output side, the input buffers 16 and 17 respectively receive them, and the phase shift circuit 30 sets the phase shift amount of the data strobe signal DQS to 0 (zero) and outputs it to the sampling circuit 40.

Further, the control circuit 10 may be structured as a BIST (Built-In Self Test) circuit that comprises a pattern generator for generating pattern data and a checker for comparing the pattern data looped back with an expected value and that performs a self test by the loop-back test, however, it is not limited to this structure.

Further, the data signal DQ and the data strobe signal DQS fed to the latch circuits 12 and 13 in FIG. 1 are supplied by a memory controller, not shown in the drawing, (controlled by a CPU also not shown in the drawing) to which the interface is connected, however, it is not limited to this structure. Or the DQ and the DQS fed to the latch circuits 12 and 13 may be outputted from the control circuit 10 during the test.

How the input function is tested will be described. In order to test the phase shift circuit 30 and the sampling circuit 40, the phase shift circuit 20 on the output side aligns (puts in a synchronized state) the phases of the data signal DQ and the data strobe signal DQS and outputs them. In this case, the phase of the sampling clock of the data signal DQ is shifted by 180 degrees and the data signal DQ is outputted having the same phase as that of the data strobe signal DQS. The latch circuits 12 and 13, respectively, sample the data signal DQ and the data strobe signal DQS using sampling clocks (whose phases are shifted by 180 degrees from that of the input clock) having the same phase from the phase shift circuit 20. The data signal DQ and the data strobe signal DQS having the same phase are looped back to the input buffers 16 and 17, respectively, on the input side from the output buffers 14 and 15. The phase of the data strobe signal DQS is shifted by 90 degrees by the phase shift circuit 30, and the sampling circuit 40 samples the data signal DQ from the output buffer 16 using this data strobe signal DQS whose phase is shifted by 90 degrees.

Next, how the output function (function of the output side) is tested will be described. In order to test the output function, the control circuit 10 controls the phase shift circuit 30 not to shift the phase of the data strobe signal DQS on the input side. The phase shift amount by the phase shift circuit 30 is set to 0 degree.

Since the phase shift circuit 20 on the output side sets the phase shift amount of the data sampling clock to 90 degrees and fixes the phase shift amount of the data strobe signal DQS at 180 degrees, the data strobe signal DQS whose phase has already been shifted by 90 degrees from that of the data signal DQ is outputted from the output buffer 15. The data signal DQ and the data strobe signal DQS respectively outputted from the output buffers 14 and 15 are fed to the input buffers 16 and 17 respectively. The data strobe signal DQS outputted from the input buffer 17 is fed to the phase shift circuit 30, and it is outputted to the sampling circuit 40 without its phase being shifted. The sampling circuit 40 samples the data signal DQ looped back in response to the data strobe signal DQS whose phase has already been shifted by 90 degrees by the phase shift circuit 20 on the output side.

As described above, the loop-back test for the phase function of the input or output side is made possible by adding a mode in which the phase is not shifted to the phase shift circuit 30 in the present invention. Therefore, when testing an interface such as the DDR SDRAM in which the input and output phases of data and strobe signals are different, a high-speed loop-back test can be performed using an inexpensive low-speed tester. The present invention will be further described with reference to an embodiment.

Embodiment

Figure 2:
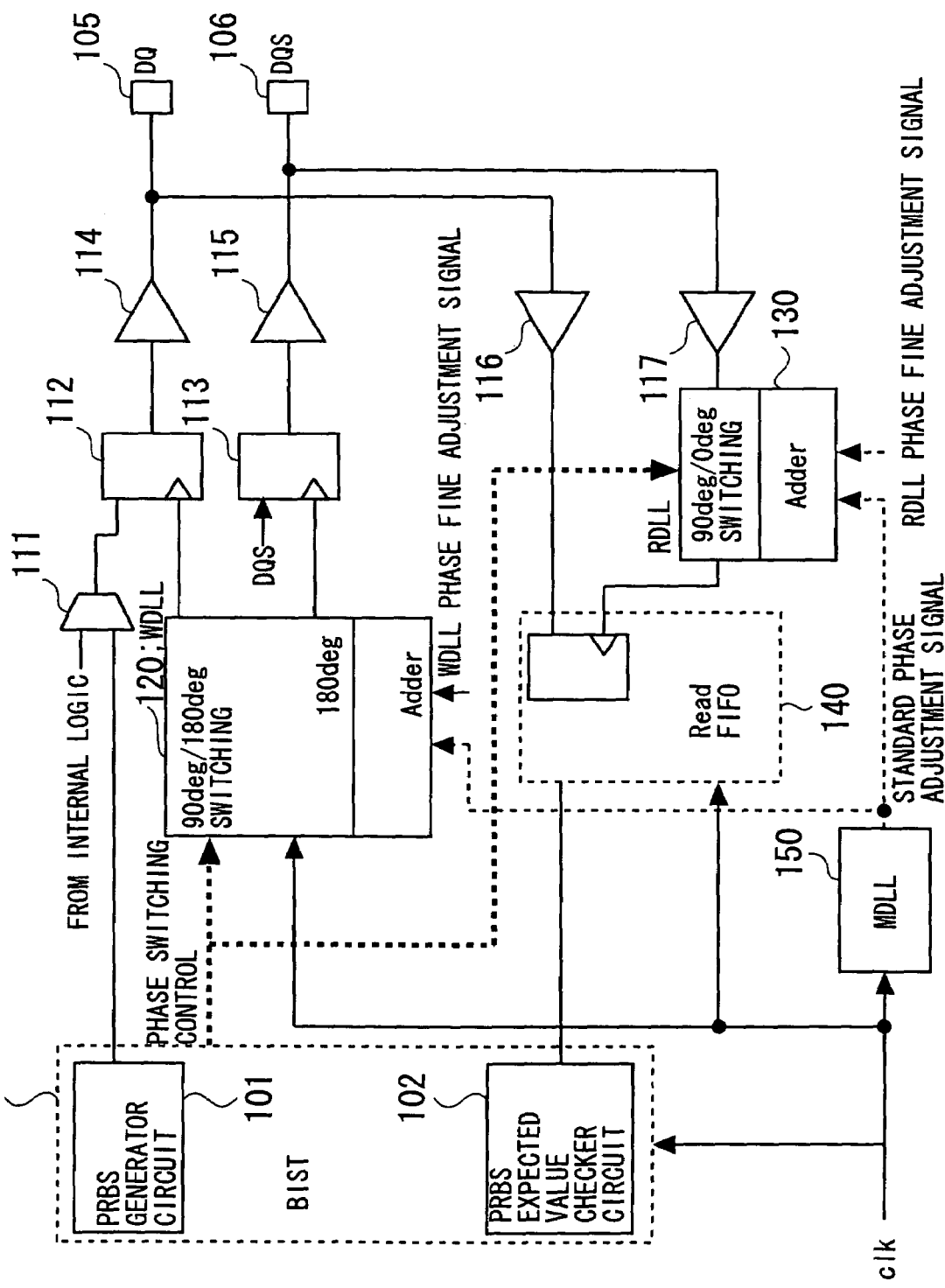
FIG. 2 is a drawing illustrating the structure of an embodiment of the present invention.

FIG. 2 is a drawing illustrating the structure of a semiconductor device of an embodiment of the present invention, and the structure of the input and output for DQ and DQS in an interface circuit of a DDR SDRAM is shown. In FIG. 2, a BIST (Built-In Self Test) circuit 100 built in the circuit comprises a PRBS (Pseudo Random Bit Sequence) generator circuit 101 (a pattern generator) for generating a pseudo random binary sequence, and a PRBS expected value checker circuit 102 for comparing a pattern looped back and fed to an input buffer from an output buffer with an expected value pattern. The PRBS generator circuit 101 and the PRBS expected value checker circuit 102 verify the loop-back path.

A selector 111 that receives data from the internal logic of the semiconductor device and pattern data from the PRBS generator circuit 101 selects the data from the internal logic of the semiconductor device during normal operation and selects the pattern data from the PRBS generator circuit 101 during a test.

Figure 3:
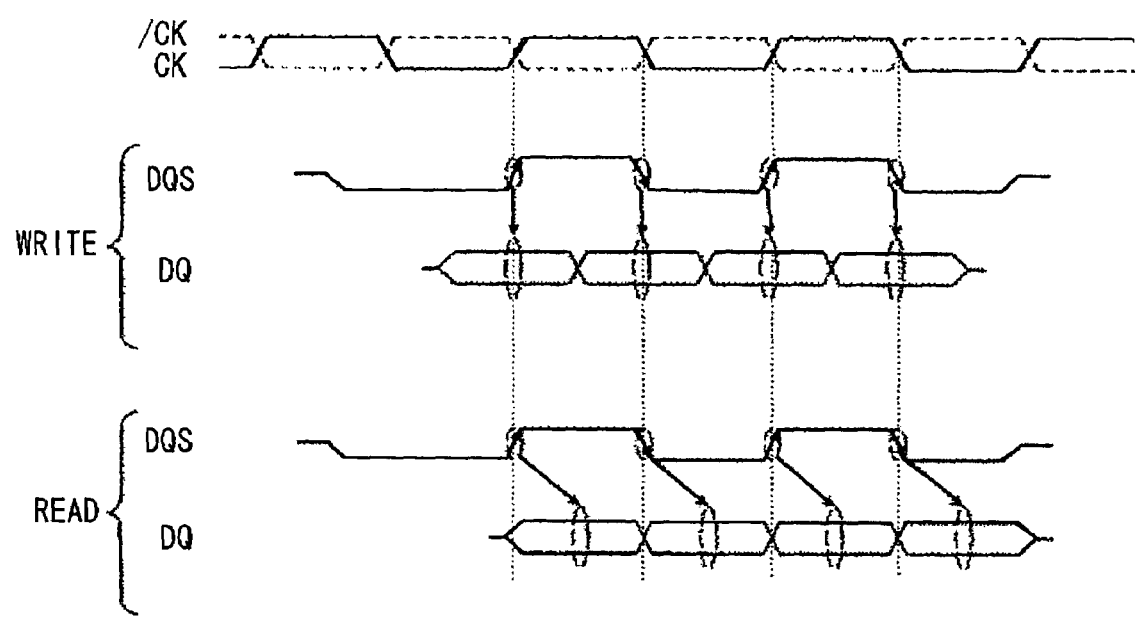
FIG. 3 is a timing diagram illustrating the edges of DQ and DQS of a DDR SDRAM during write and read operations.
Figure 4:
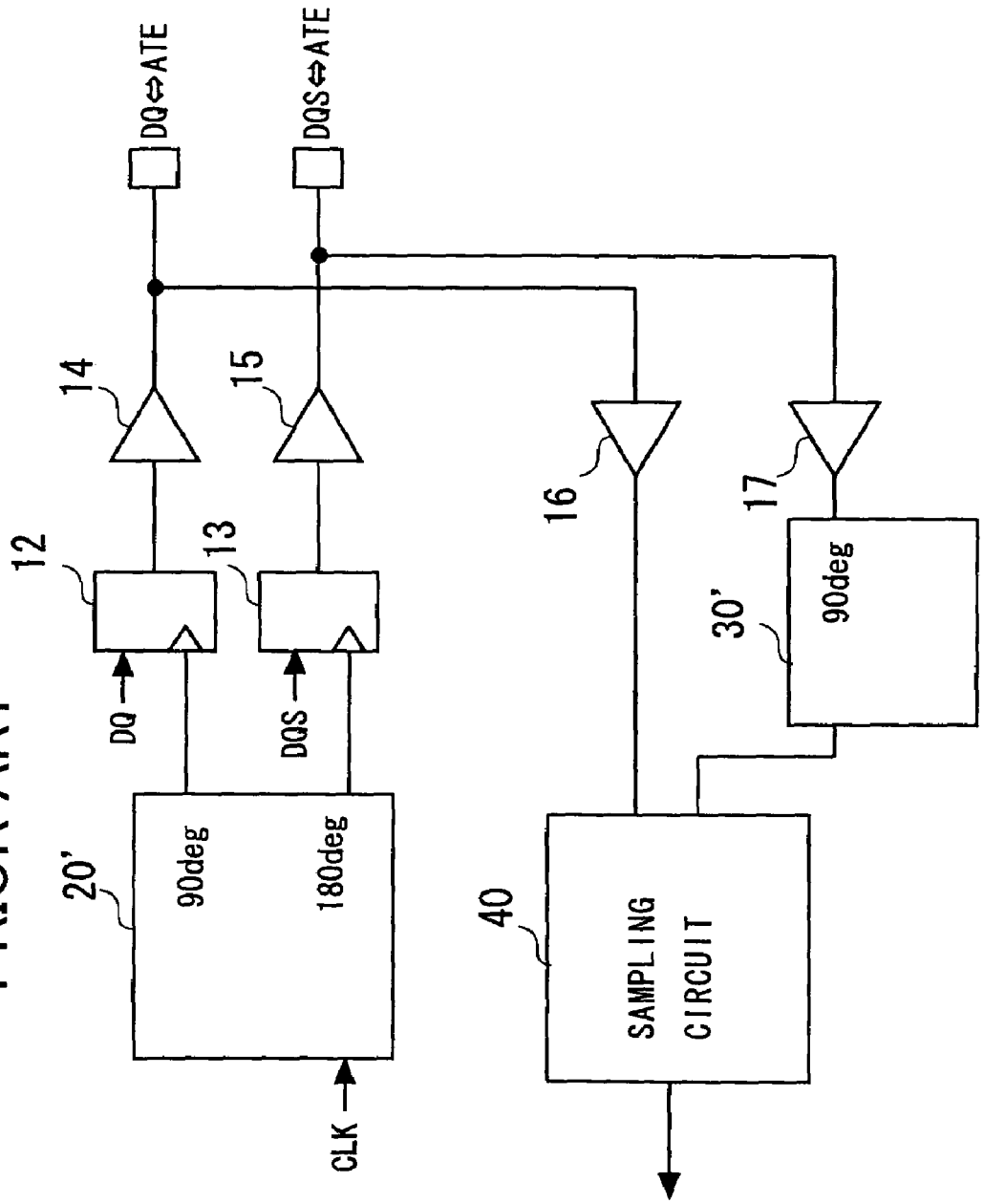
FIG. 4 is a drawing showing a conventional and typical structure of an interface circuit of a DDR SDRAM.

On the output side, a WDLL (Write Delay Lock Loop) 120 receives a system clock signal clk (a.k.a. "core clock"), which is synchronized with the clock CK of the DDR SDRAM in FIG. 3, and a phase switching control signal from the BIST circuit 100, and it controls the phases of the sampling clocks of the data DQ and the data strobe signal DQS. Further, the device comprises a latch circuit 112 for sampling a data signal outputted from the selector 111 in response to a clock signal from the WDLL 120, an output buffer 114 for receiving an output of the latch circuit 112 and outputting it to an input/output terminal (DQ) 105 for the data signal, a latch circuit 113 for sampling the data strobe signal DQS in response to the clock signal from the WDLL 120, and an output buffer 115 for receiving an output of the latch circuit 113 and outputting it to an input/output terminal (DQS) 106 for the data strobe signal. Further, the data strobe signal DQS fed to the latch circuit 113 is supplied from the controller (not shown in the drawing) during normal operation, however, a selector (not shown in the drawing) may switch so that the BIST circuit 100 generates and supplies the signal during a test.

On the input (receiving) side, the device comprises an input buffer 116 whose input end is connected to an output of the output buffer 114 and the terminal 105, an input buffer 117 whose input end is connected to an output of the output buffer 115 and the terminal 106, an RDLL (Read Delay Lock Loop) 130 for receiving an output of the input buffer 117, a read FIFO (First In First Out) unit 140 for sampling an output of the input buffer 116 using an output clock of the RDLL 130, and an MDLL (Master Delay Lock Loop) 150 for receiving the clock clk and generating a standard (master) phase adjustment signal.

Further, DLL (Delay Lock Loop) circuits such as the WDLL 120 and the RDLL 130 are used as the phase shift circuits 20 and 30 in FIG. 1 in the present embodiment. For the DLL circuits used in the present embodiment, any known structure in which an amount of phase delay is selectable may be used. For instance, they comprise a delay circuit in which the delay time of an output signal is variable, a phase comparator for receiving the output signal fed back and comparing the phase of the signal with that of an input signal for the delay circuit, and a selector control circuit for variable-controlling the delay amount of the output signal, such as selecting an output tap of the delay circuit, so that the phases of the output signal and the input signal are in a predetermined relationship (for instance 90 degrees, 180 degrees or no delay) based on the result of the phase comparison by the phase comparator. As long as it is a circuit in which the phase of the clock can be set to a desired value, any circuit structure such as phase interpolator or the like may be used.

The RDLL 130 switches between the phases 90 degrees and 0 degree based on the phase switching control signal from the BIST circuit 100. An adder of the RDLL 130 adds the standard phase adjustment signal (the reference clock supplied to the RDLL) from the MDLL 150 and an RDLL phase fine adjustment signal (a signal for fine adjustment) which is set and supplied externally, and the phase shift amount is synchronized and controlled based on the addition result. When the phase shift amount is 0, the RDLL performs feedback control so that a signal having the same phase as that of the signal supplied is outputted.

An adder of the WDLL 120 adds a WDLL phase fine adjustment signal (the reference clock supplied to the WDLL) and the standard phase adjustment signal.

Referring to FIG. 2, the operation of the present embodiment will be described. First, the normal operation will be explained.

During a normal write operation, the selector 111 selects the data from the internal logic. The WDLL 120 outputs a clock for sampling the data with its phase shifted by 90 degrees. The WDLL 120 outputs a clock for sampling the DQS with its phase shifted by 180 degrees. During the normal operation, a write data signal DQ and the data strobes signal DQS whose phase is shifted by 90 degrees in relation to that of the write data signal DQ are supplied to the DDR SDRAM.

Further, during a normal read operation, the data signal (read data) DQ and the data strobe signal DQS having the same phase are fed to the input buffers 116 and 117 respectively from the DDR SDRAM. The RDLL 130 shifts the phase of the data strobe signal DQS outputted from the input buffer 117 by 90 degrees and outputs it, and the read FIFO 140 samples the read data using the data strobe signal from the RDLL 130 as the sampling clock. The sampled data is supplied to a CPU (not shown in the drawing) via the controller (not shown in the drawing).

Next, the operation of the loop-back test by the BIST circuit 100 will be described.

When testing the input function (function of the input side), the BIST 100 outputs the phase switching control signal to the WDLL 120 in order to test the RDLL 130's function of shifting phases by 90 degrees and the functions of the read FIFO 140 on the input side, and the WDLL 120 controls so that the data DQ and the data strobe signal DQS are outputted with their phases aligned.

Concretely, the WDLL 120 sets the phase of the DQS to 180 degrees and the phase of the DQ to 180 degrees in relation to that of the clock. Then the BIST circuit 100 supplies the phase switching control signal to the RDLL 130 and sets the phase shift amount of the RDLL 130 to 90 degrees. The DQ and DQS having the same phase are fed to the input buffers 116 and 117 from the output buffers 114 and 115 respectively and are sampled by the read FIFO 140 using the clock obtained by shifting the phase of the DQS by 90 degrees by the RDLL 130. The PRBS expected value checker circuit 102 which has received the data from the read FIFO 140 compares it with an expected value pattern and outputs a "PASS" signal when they coincide.

Further, when testing the output function, the BIST circuit 100 outputs the phase switching control signal to the RDLL 130 and sets the phase shift amount of the RDLL 130 to 0 degree so that the phase of the data strobe signal DQS from the input buffer 117 is not shifted. The data strobe signal DQS whose phase has already been shifted by 90 degrees in relation to that of the data signal DQ on the output side is looped back to the input side and is sampled by the read FIFO 140.

Note that the switching of the phase shift amounts on the input and output sides mentioned above in the present embodiment is merely an example and the present invention is not limited to this formulation. For instance, the phases of the DQ and DQS are aligned and set to 180 degrees in relation to that of the clock CLK on the output side, however, they do not need to be 180 degrees and it may be set to the same phase A (where A>90). In this case, the WDLL 120 switches between A−90 and A as the phase shift amount for the sampling clock of the data DQ.

According to the present embodiment, testing the phase function of only the input side or the output side by the loop-back test is made possible by adding the phase switching function to the WDLL 120 that performs phase shift and the mode in which the phase is not shifted to the RDLL 130. Therefore, an interface in which the input and output phases of data and strobe signals are different such as DDR SDRAM can be tested by the high-speed loop-back test using an inexpensive low-speed tester. Further, when testing the interface by the high-speed loop-back test using a tester with a low test rate, the frequency of the clock supplied by the tester may be multiplied by a multiplication circuit of a test jig on the load board of the tester before being supplied to the interface—the DUT (Device Under Test)—since the operation frequency of the interface (DUT) is high.

Further, the phase shift amount of the data strobe signal DQS is fixed at 180 degrees on the output side and the phase shift amount of the data DQ is switched between 90 degrees and 180 degrees in the above-described embodiment, however, a structure in which the phase shift amount of the data DQ is fixed at 90 degrees and the phase shift amount of the data strobe signal DQS is switched between 90 degrees and 180 degrees may be employed. Further, the phase shift amount of the data strobe signal DQS is switched between 90 degrees and 0 degree by the RDLL on the input side in the embodiment described above, however, the present invention is not limited to this formulation. For instance, the phase shift amount of the data strobe signal DQS may be set to a fixed value A (where A>90) while the phase shift amount of the data signal is switched between A−90 and A.

Further, the interface circuit of a DDR SDRAM in which the phases of the DQ and DQS are the same during read operations and the phase difference between the DQ and DQS is 90 degrees during write operations is described in the above-described embodiment, however, the present invention is not limited to the interface of the DDR SDRAM. In other words, it can be similarly applied to any case where the input and output phases of a data signal and a strobe signal that regulates the timing to sample the data at an opposite device are different (except for cases where the phase relationship is as follows: input: 0 degree; output: 90 degrees). Further, a structure in which the phase shift circuit 20 in FIG. 1 selects one from two or more phase shift amounts and the phase shift circuit 30 selects one from two or more phase shift amounts may be employed.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. An interface circuit for receiving and outputting a data signal and a strobe signal that regulates a timing of sampling the data signal in which phase relationships between said data signal and said strobe signal are different from each other between an input and an output, said interface circuit comprising:

a first circuit that controls to switch a phase difference between said data signal and said strobe signal outputted on a side that outputs said data signal and said strobe signal, said first circuit varying a phase shift amount of at least one of an output data signal and an output strobe signal based on a phase switching control signal; and a second circuit that controls to switch a phase difference between said data signal and said strobe signal received on a side that receives said data signal and said strobe signal, said second circuit varying a phase shift amount of at least one of a received data signal and a received strobe signal based on said phase switching control signal.

2. An interface circuit for receiving and outputting a data signal and a strobe signal that regulates a timing of a sampling of the data signal in which phase relationships between said data signal and said strobe signal are different from each other between an input and an output, the interface circuit comprising:

an output side circuit that outputs said data signal and said strobe signal, said output side circuit comprising a first phase shift circuit that selects one phase shift amount from at least two phase shift amounts based on a phase switching control signal, to shift a phase of said data signal by the selected phase shift amount, and to shift a phase of said strobe signal by a predetermined phase shift amount; and an input side circuit that receives said data signal and said strobe signal, said input side circuit comprising:

a second phase shift circuit that selects one phase shift amount from at least two phase shift amounts based on said phase switching control signal, to shift the phase of said strobe signal received by the selected phase shift amount; and a sampling circuit that samples a data signal received in response to a strobe signal output from said second phase shift circuit.

3. The interface circuit as defined in claim 2, wherein said first and second phase shift circuits, during normal read and write operations, respectively select a phase shift amount regulated according to a predetermined input and output phase relationship between said data signal and said strobe signal, and wherein, during testing, said first and second phase shift circuits select a phase shift amount specified by said phase switching control signal according to a test content to verify whether the phase relationship between a data signal and a strobe signal in said input side circuit is normal and whether the phase relationship between a data signal and a strobe signal in said output side circuit is normal, by looping back the data signal and the strobe signal to said input side circuit from said output side circuit.

4. The interface circuit as defined in claim 2, wherein, during a normal write operation, said first phase shift circuit shifts the phase of said data signal so that a relative phase between said data signal and said strobe signal is a first predetermined value in said output side circuit, wherein, during a normal read operation, said second phase shift circuit shifts the phase of said strobe signal received by said first predetermined value and outputs the shifted phase of said strobe signal to said sampling circuit in said input side circuit, and wherein, when said input side circuit is tested, said first phase shift circuit aligns the phases of said data signal and said strobe signal in said output side circuit, said input side circuit receives a data signal and a strobe signal having a same phase output from said output side circuit, and said second phase shift circuit shifts the phase of said strobe signal by said first predetermined value and outputs the shifted phase of said strobe signal to said sampling circuit.

5. The interface circuit as defined in claim 2 wherein, when said output side circuit is tested, said first phase shift circuit sets a relative phase between said data signal and said strobe signal to said first value in said output side circuit and said second phase shift circuit sets the phase shift amount of said strobe signal received to zero in said input side circuit.

6. The interface circuit as defined in claim 4 wherein, when said output side circuit is tested, said first phase shift circuit sets the relative phase between said data signal and said strobe signal to said first value in said output side circuit and said second phase shift circuit sets the phase shift amount of said strobe signal received to zero in said input side circuit.

7. The interface circuit as defined in claim 2, wherein said data signal and said strobe signal comprise a data signal and a data strobe signal of a double data rate synchronous dynamic random access memory (DDR SDRAM), during a normal write operation, wherein said first phase shift circuit sets the phase difference between said data signal and said strobe signal to 90 degrees in said output side circuit, wherein, during a normal read operation, said second phase shift circuit shifts the phase of a strobe signal received by 90 degrees and outputs the strobe signal to said sampling circuit in said input side circuit, and wherein, when said input side circuit is tested, said first phase shift circuit aligns the phases of said data signal and said strobe signal in said output side circuit, said input side circuit receives the data signal and the strobe signal having the same phase outputted from said output side circuit, and said second phase shift circuit shifts the phase of said strobe signal received by 90 degrees.

8. The interface circuit as defined in claim 2, wherein when said output side circuit is tested, said first phase shift circuit sets the phase difference between said data signal and said strobe signal to 90 degrees in said output side circuit, and wherein, when said input side circuit receives a data signal and a strobe signal having the same phase outputted from said output side circuit, said second phase shift circuit sets the phase shift amount of said strobe signal received to zero.

9. The interface circuit as defined in claim 7, wherein, when said output side circuit is tested, said first phase shift circuit sets the phase difference between said data signal and said strobe signal to 90 degrees in said output side circuit, and wherein, when said input side circuit receives a data signal and a strobe signal having the same phase outputted from said output side circuit, said second phase shift circuit sets the phase shift amount of said strobe signal received to zero.

10. The interface circuit as defined in claim 2, wherein at least one of said first and second phase shift circuits comprises a delay locked loop circuit.

11. The interface circuit as defined in claim 2 further comprising a pattern generator circuit that generates a test pattern and a checker circuit that receives data sampled by said sampling circuit of said input side circuit so as to compare the sampled data with an expected value pattern, wherein a phase of a test pattern from said pattern generator circuit is shifted as said data signal, and said test pattern is looped back to said input side circuit from said output side circuit during test.

12. A semiconductor device comprising the interface circuit as defined in claim 1.

13. A semiconductor device comprising the interface circuit as defined in claim 2.

* * * * *